US012732187B2

(12) United States Patent
Wu et al.

(10) Patent No.: US 12,732,187 B2
(45) Date of Patent: Sep. 8, 2026

(54) VOLTAGE MONITOR AND OFF-CHIP DRIVER OF MEMORY DEVICE

(71) Applicant: NANYA TECHNOLOGY CORPORATION, New Taipei City (TW)

(72) Inventors: Chang-Ting Wu, Hsinchu County (TW); Chih-Jen Chen, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 134 days.

(21) Appl. No.: 18/789,714

(22) Filed: Jul. 31, 2024

(65) Prior Publication Data

US 2026/0039295 A1 Feb. 5, 2026

(51) Int. Cl.
*H03K 17/687* (2006.01)
*G11C 11/4074* (2006.01)
*G11C 29/50* (2006.01)

(52) U.S. Cl.
CPC ...... *H03K 17/6872* (2013.01); *G11C 11/4074* (2013.01); *G11C 29/50004* (2013.01); *G11C 2029/5004* (2013.01)

(58) Field of Classification Search
CPC ............ H03K 17/6872; G11C 11/4074; G11C 29/50004; G11C 2029/5004; G11C 29/021; G11C 29/028; G11C 29/12005; G11C 29/1201; G11C 29/48; G11C 29/50012
USPC .......................................................... 365/226
See application file for complete search history.

(56) References Cited

U.S. PATENT DOCUMENTS 5,914,898 A * 6/1999 Sher ...................... G11C 7/1051 326/27
9,543,954 B2 * 1/2017 Wu .................. H03K 19/00384
2007/0057692 A1 * 3/2007 Chuang .............. H03K 19/0005 326/30
2012/0056642 A1 3/2012 Song et al.
(Continued)

FOREIGN PATENT DOCUMENTS

DE 102004035273 A1 * 3/2005 ....... H03K 19/01707
WO WO-9941836 A1 * 8/1999 ....... H03K 19/00315

OTHER PUBLICATIONS

"Notice of allowance of Taiwan Counterpart Application", issued on Sep. 3, 2025, p. 1-p. 3.

*Primary Examiner* — Fernando Hidalgo
(74) *Attorney, Agent, or Firm* — JCIPRNET

(57) ABSTRACT

A voltage monitor of a memory device and an off-chip driver (OCD) are provided. the voltage monitor includes a first voltage divider, a bridge switch, an OCD and a control circuit. The first voltage divider receives an internal voltage in the memory device, and divides the internal voltage to generate a sensing signal on a sensing node. The bridge switch is coupled between the sensing node and a connecting pad. The OCD includes a pull-up circuit and a pull-down circuit. The control circuit is coupled to the bridge switch and the OCD. In a test mode, the control circuit turns on the bridge switch. In the test mode, the control circuit provides a bias voltage to the OCD to let a first current value of a first leakage current flowing through the pull-up circuit match a second current value of a second leakage current flowing through the pull-down circuit.

18 Claims, 6 Drawing Sheets

(56) References Cited

U.S. PATENT DOCUMENTS

| | | | | |
|---|---|---|---|---|
| 2014/0002146 | A1* | 1/2014 | Kim | H03K 19/018521 327/333 |
| 2020/0076429 | A1* | 3/2020 | Anand | H03K 17/6877 |

* cited by examiner

VOLTAGE MONITOR AND OFF-CHIP DRIVER OF MEMORY DEVICE

BACKGROUND

Technical Field

The disclosure relates to a voltage monitor and an off-chip driver (OCD) of a memory device.

Description of Related Art

FIG. 1 illustrates a schematic diagram of an off-chip driver and a switch. Generally, a memory device needs a setting resistance value to decides at least one of operation parameter of the memory device. The setting resistance value is set by an external matching resistance value provided by an off-chip driver (OCD) 11 through a connecting pad DQPAD.

In order to decrease a number of pads of the memory device, the memory device monitors a sensing signal SSEN corresponding to an internal voltage in the memory device through the connecting pad DQPAD. In a test mode, the switch 12 is turned on. A pull-up switch MP and a pull-down switch MN of the OCD 11 are turned off in response to enable signals PUPEN and PDNEN. Therefore, the memory device can monitor an internal voltage through the connecting pad DQPAD. However, each of the pull-up switch MP and the pull-down switch MN has a threshold voltage having a low absolute value. A leakage current may be generated corresponding to a subthreshold leakage current of the pull-up switch MP or the pull-down switch MN. In the test mode, the leakage current flowing through at least one of the pull-up switch MP and the pull-down switch MN to the connecting pad DQPAD is generated. Thus, the sensing signal SSEN on the connecting pad DQPAD is inaccurate.

Therefore, how to improve an accuracy of the sensing signal SSEN on the connecting pad DQPAD is one of the research and development focuses of those skilled in the art.

SUMMARY

The disclosure provides a voltage monitor and an off-chip driver (OCD) of a memory device including and a connecting pad. In a test mode, the voltage monitor can balance a leakage current in the OCD to improve an accuracy of a sensing signal corresponding to an internal voltage in the memory device on the connecting pad.

In an embodiment of the disclosure, the voltage monitor of a memory device includes a first voltage divider, a bridge switch, an off-chip driver (OCD) and a control circuit. The first voltage divider is coupled to a sensing node. The first voltage divider receives an internal voltage in the memory device, and divides the internal voltage to generate a sensing signal on the sensing node. A first terminal of the bridge switch is coupled to the sensing node. A second terminal of the bridge switch is coupled to a connecting pad. The OCD includes a pull-up circuit and a pull-down circuit. The pull-up circuit is coupled between a high reference voltage and the connecting pad. The pull-down circuit is coupled between the connecting pad and a low reference voltage. The control circuit is coupled to the bridge switch and the OCD. In the test mode, the control circuit turns on the bridge switch. In the test mode, the control circuit provides a bias voltage to the OCD to let a first current value of a first leakage current flowing through the pull-up circuit match a second current value of a second leakage current flowing through the pull-down circuit.

In an embodiment of the disclosure, the OCD includes a connecting pad, a pull-up circuit, a pull-down circuit and a control circuit. The connecting pad outputs a sensing signal corresponding to an internal voltage in the memory device. The pull-up circuit includes a control switch and a pull-up switch. A first terminal of the control switch is coupled to a high reference voltage. The pull-up switch is coupled between a second terminal of the control switch and the connecting pad. The pull-down circuit is coupled between the connecting pad and a low reference voltage. The control circuit is coupled to the pull-up circuit. When the memory device is in a test mode, the control circuit turns off the control switch, and provides a bias voltage to the second terminal of the control switch to adjust a first current flowing through the pull-up circuit.

In an embodiment of the disclosure, the OCD includes a connecting pad, a pull-up circuit, a pull-down circuit and a control circuit. The connecting pad outputs a sensing signal corresponding to an internal voltage in the memory device. The pull-up circuit is coupled between a high reference voltage and the connecting pad. The pull-down circuit includes a control switch and a pull-down switch. A first terminal of the control switch is coupled to a low reference voltage. The pull-down switch is coupled between a second terminal of the control switch and the connecting pad. The control circuit is coupled to the pull-down circuit. When the memory device is in a test mode, the control circuit turns off the control switch, and provides a bias voltage to the second terminal of the control switch to adjust a current flowing through the pull-down circuit.

Based on the above, in the test mode, the control circuit turns on the bridge switch and provides the bias voltage to the OCD to let the first current value of the first leakage current flowing through the pull-up circuit match the second current value of the second leakage current flowing through the pull-down circuit. Therefore, in the test mode, the first leakage current and the second leakage current on the connecting pad are balanced. In this way, in the test mode, the sensing signal on the connecting pad is not interfered with the first leakage current or the second leakage current. The voltage monitor can improve the accuracy of the sensing signal on the connecting pad in the test mode.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
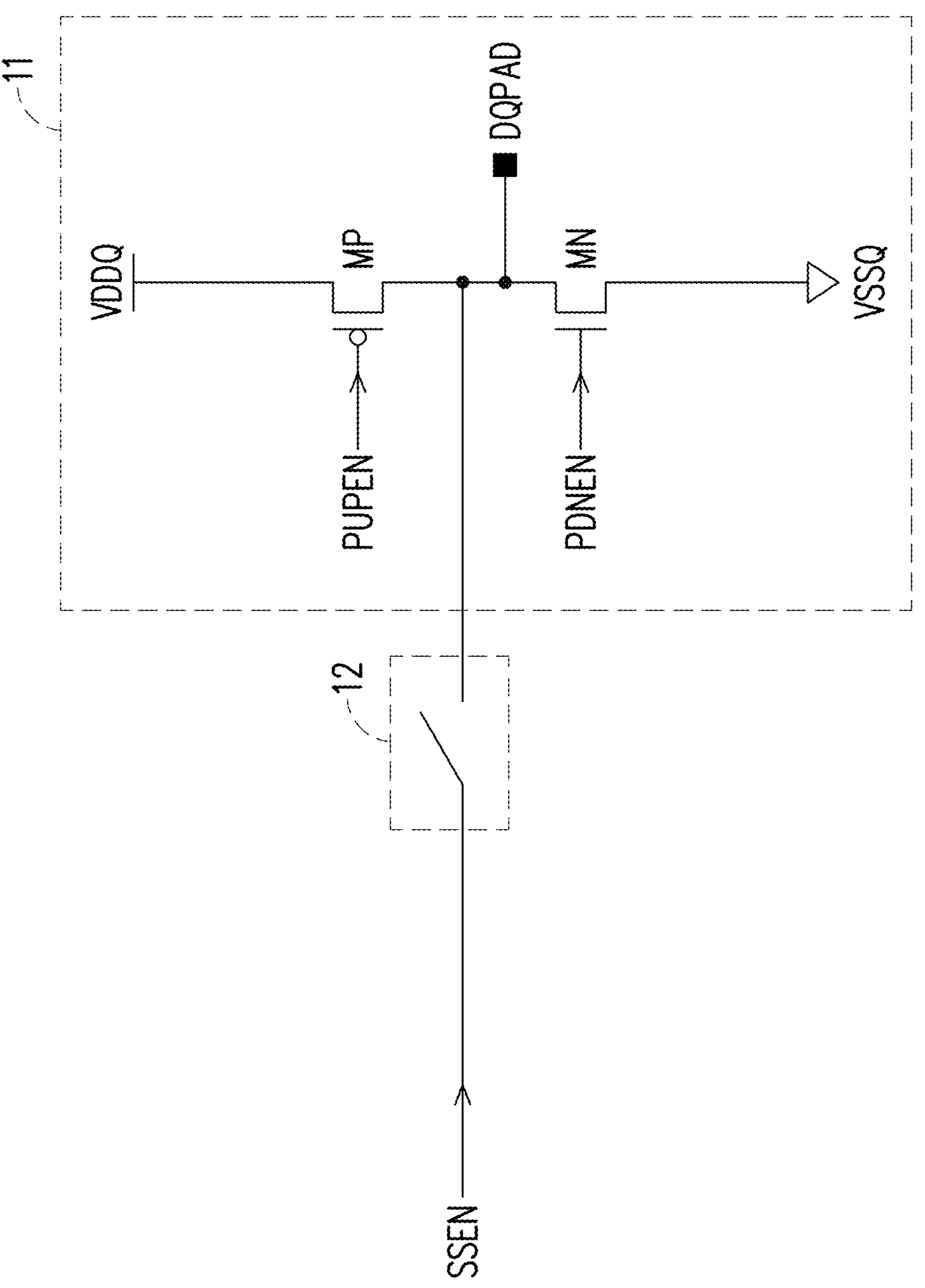
FIG. 1 illustrates a schematic diagram of an off-chip driver and a switch.
Figure 2:
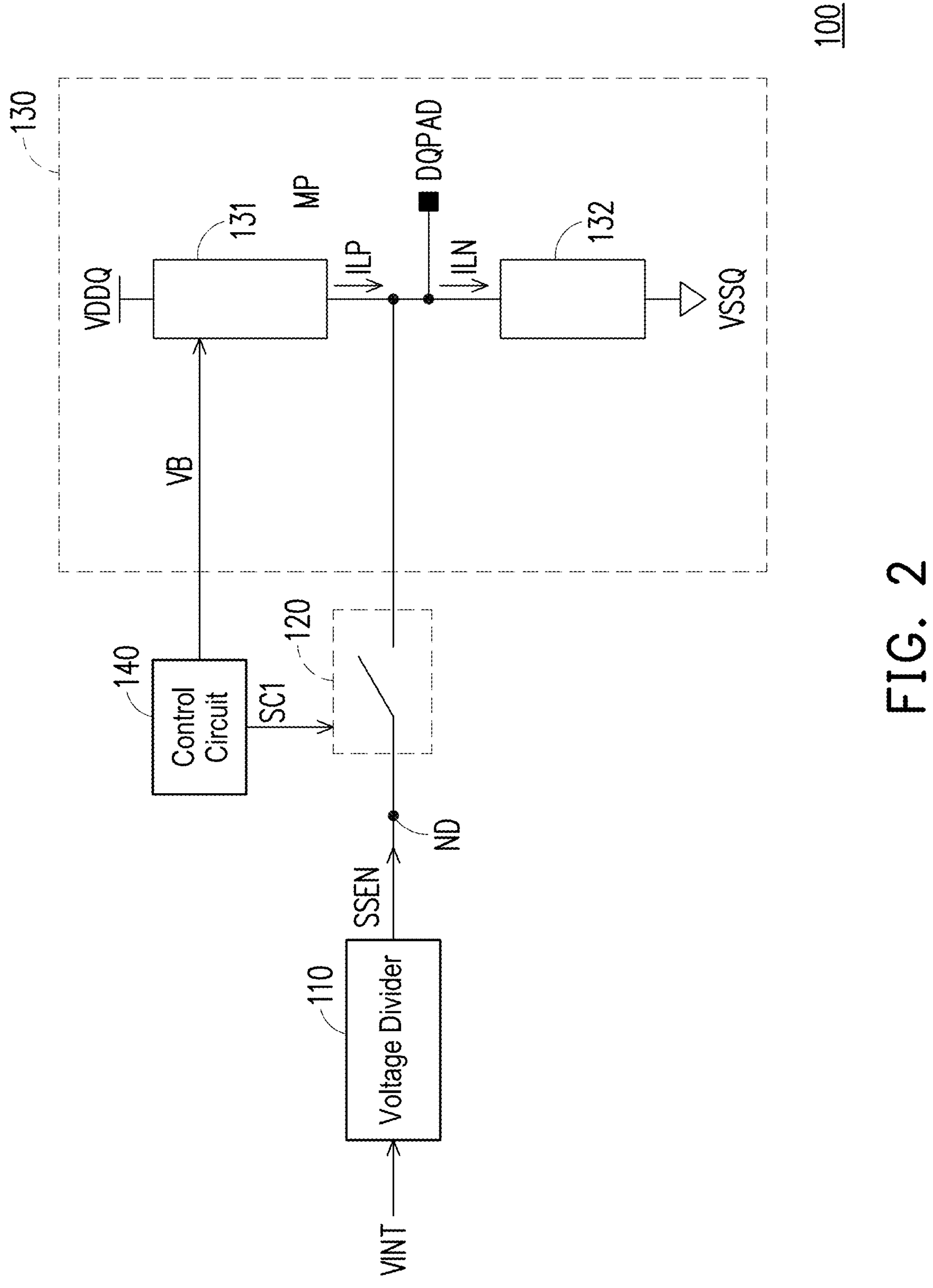
FIG. 2 illustrates a schematic diagram of a voltage monitor according to an embodiment of the disclosure.

Please refer to FIG. 2, FIG. 2 illustrates a schematic diagram of a voltage monitor according to an embodiment of the disclosure. In the embodiment, the voltage monitor 100 of a memory device includes a voltage divider 110, a bridge switch 120, an off-chip driver (OCD) 130 and a control circuit 140. The voltage divider 110 is coupled to a sensing node ND. The voltage divider 110 receives an internal voltage VINT of the memory device, and divides the internal voltage VINT to generate a sensing signal SSEN on the sensing node ND. The sensing signal SSEN may be a sensing voltage or a sensing current. For example, the memory device may be a dynamic random-access memory (DRAM). The internal voltage VINT may be one of the internal reference voltages VDD, VSS, VREFDQ, a high reference voltage VDDQ and a low reference voltage VSSQ for the memory device, but the disclosure is not limited thereto.

In the embodiment, a first terminal of the bridge switch 120 is coupled to the sensing node ND. A second terminal of the bridge switch 120 is coupled to a connecting pad DQPAD.

In the embodiment, the OCD 130 includes a pull-up circuit 131 and a pull-down circuit 132. The pull-up circuit 131 is coupled between the high reference voltage VDDQ and the connecting pad DQPAD. The pull-down circuit 132 is coupled between the connecting pad DQPAD and a low reference voltage VSSQ.

In the embodiment, the control circuit 140 is coupled to the bridge switch 120 and the OCD 130. In a test mode, the control circuit 140 turns on the bridge switch 120. In a test mode, the control circuit 140 provides a bias voltage VB to the OCD to let a first current value of a first leakage current ILP flowing through the pull-up circuit 131 match a second current value of a second leakage current ILN flowing through the pull-down circuit 132.

Generally, in the test mode, the pull-up circuit 131 and the pull-down circuit 132 are disable. However, each of transistors of the pull-up circuit 131 and the pull-down circuit 132 has a threshold voltage having a low absolute value. This, the first leakage current ILP and the second leakage current ILN may be generated in the test mode. A voltage value of the sensing signal SSEN on the connecting pad DQPAD is increased according to increasing of the first leakage current ILP. The voltage value of the sensing signal SSEN on the connecting pad DQPAD is decreased according to increasing of the second leakage current ILN. Thus, the voltage value of the sensing signal SSEN on the connecting pad DQPAD is interfered with the first leakage current ILP or/and the second leakage current ILN.

It should be noted, in the embodiment, in the test mode, the control circuit 140 turns on the bridge switch 120 using a control signal SC1 and provides the bias voltage VB to the OCD 130. The first current value of the first leakage current ILP flowing through the pull-up circuit 131 matches the second current value of the second leakage current ILN flowing through the pull-down circuit 132 (that is, $ILP-ILN\approx 0$). The first current value of the first leakage current ILP flowing through the pull-up circuit 131 is substantially equal to or similar to the second current value of the second leakage current ILN flowing through the pull-down circuit 132. Therefore, in the test mode, the first leakage current and the second leakage current on the connecting pad DQPAD are balanced. In this way, in the test mode, the sensing signal SSEN on the connecting pad DQPAD is not interfered with the first leakage current ILP and the second leakage current ILN. The voltage monitor 100 can improve the accuracy of the sensing signal SSEN on the connecting pad DQPAD in the test mode.

In the embodiment, the bridge switch 120 is turned off in a normal mode and stops to provide the bias voltage VB within the range between the low reference voltage VSSQ and the high reference voltage VDDQ. The OCD 130 operates in the normal mode. For example, the OCD 130 provides external matching resistance value through the connecting pad DQPAD in the normal mode.

In the embodiment, in the test mode, the control circuit 140 provides the bias voltage VB to the pull-up circuit 131 to adjust the first current value of the first leakage current ILP, but the disclosure is not limited thereto. In some embodiments, in the test mode, the control circuit 140 provides the bias voltage VB to the pull-down circuit 132 to adjust the second current value of the second leakage current ILN.

Figure 3:
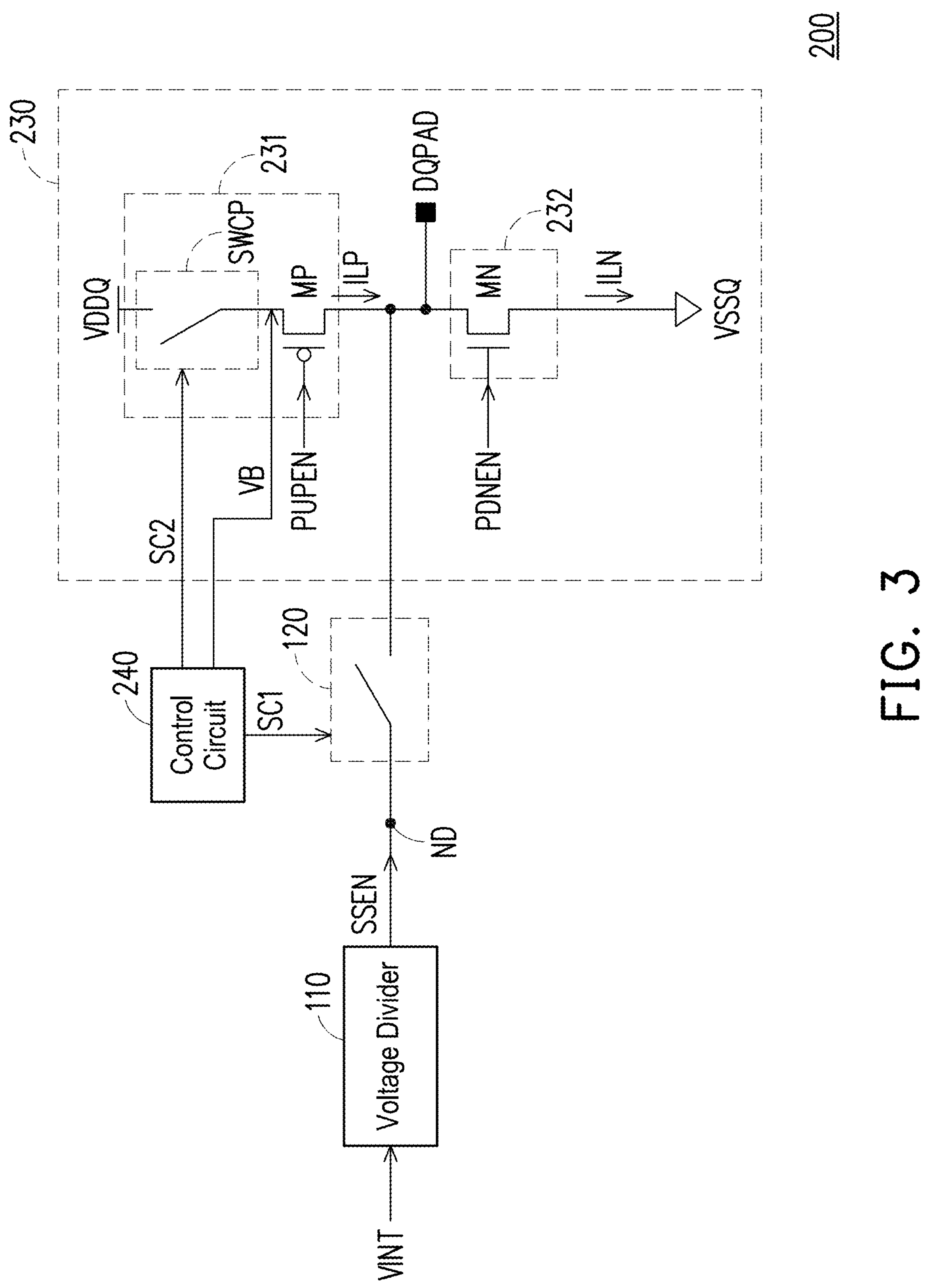
FIG. 3 illustrates a schematic diagram of a voltage monitor according to an embodiment of the disclosure.

Please refer to FIG. 3, FIG. 3 illustrates a schematic diagram of a voltage monitor according to an embodiment of the disclosure. In the embodiment, the voltage monitor 200 includes the voltage divider 110, the bridge switch 120, a OCD 230 and a control circuit 240. Connections and operations of the voltage divider 110 and the bridge switch 120 have been clearly explained in the embodiment of FIG. 2, so it will not be repeated here.

In the embodiment, the OCD 230 includes a pull-up circuit 231 and a pull-down circuit 232. The pull-up circuit 231 includes a control switch SWCP and a pull-up switch MP. The pull-down circuit includes a pull-down switch MN. A first terminal of the control switch SWCP is coupled to the high reference voltage VDDQ. The pull-up switch MP is coupled between a second terminal of the control switch SWCP and the connecting pad DQPAD. The pull-down switch MN is coupled between the connecting pad DQPAD and the low reference voltage VSSQ. The connecting pad DQPAD outputs the sensing signal SSEN corresponding to an internal voltage VINT in the memory device.

During a first period of the test mode, the control circuit 240 turns on the control switch SWCP, turns off the pull-up switch MP and the pull-down switch MN, and determines an absolute difference value between the first current value of the first leakage current ILP flowing through the pull-up circuit 131 and the second current value of the second leakage current ILN flowing through the pull-down circuit 132 according to the sensing signal SSEN on the connecting pad DQPAD. During the first period of the test mode, when the sensing signal SSEN on the connecting pad DQPAD is always equal to a voltage of the high reference voltage VDDQ or low reference voltage VSSQ, the control circuit 240 determines that the absolute difference value between the first current value and the second current value is higher than a threshold value. It means that the first leakage current ILP and the second leakage current ILN are not balance. For example, the threshold value is “0” or 0.01 milliampere (mA), but the disclosure is not limited thereto. Therefore, during a second period of the test mode, the control circuit 240 turns off the control switch SWCP, the pull-up switch MP and the pull-down switch MN, and provides the bias voltage VB to the second terminal of the control switch SWCP.

When an absolute difference value between the first current value and the second current value is lower than or equal to the threshold value, it means that the first leakage current ILP and the second leakage current ILN are balance. Therefore, the control circuit 240 operates during the first period.

For example, each of the control switch SWCP and the pull-up switch MP could be implemented by a p-type transistor, but the disclosure is not limited thereto. The pull-down switch MN could be implemented by a n-type transistor, but the disclosure is not limited thereto. A control terminal of the pull-up switch MP receives an enable signal PUPEN. A control terminal of the pull-down switch MN receives an enable signal PDNEN. In the test mode, the control circuit 240 turns on the control switch SWCP using a control signal SC2, turns off the pull-up switch MP using the enable signal PUPEN having a high logic level and the pull-down switch MN using the enable signal PDNEN having a low logic level. When the absolute difference value between the first current value and the second current value is higher than the threshold value, the control circuit 240 turns off the control switch SWCP using the control signal SC2, the pull-up switch MP and the pull-down switch MN, and provides the bias voltage VB to the second terminal of the control switch SWCP.

The second current value of the second leakage current ILN is generated according to a difference value between the voltage value of the sensing signal SSEN and a voltage value of the low reference voltage VSSQ. The first current value of the first leakage current ILP is generated according to a difference value between a voltage value of the bias voltage VB and the voltage value of the sensing signal SSEN. It should be noted, the control circuit 240 can adjust the first current value of the first leakage current ILP using the bias voltage VB according to the second current value of the second leakage current ILN, so that the first current value of the first leakage current ILP matches the second current value of the second leakage current ILN.

In some embodiments, the control circuit 240 are arranged in the OCD 230. In other words, the OCD 230 further includes the control circuit 240.

Figure 4:
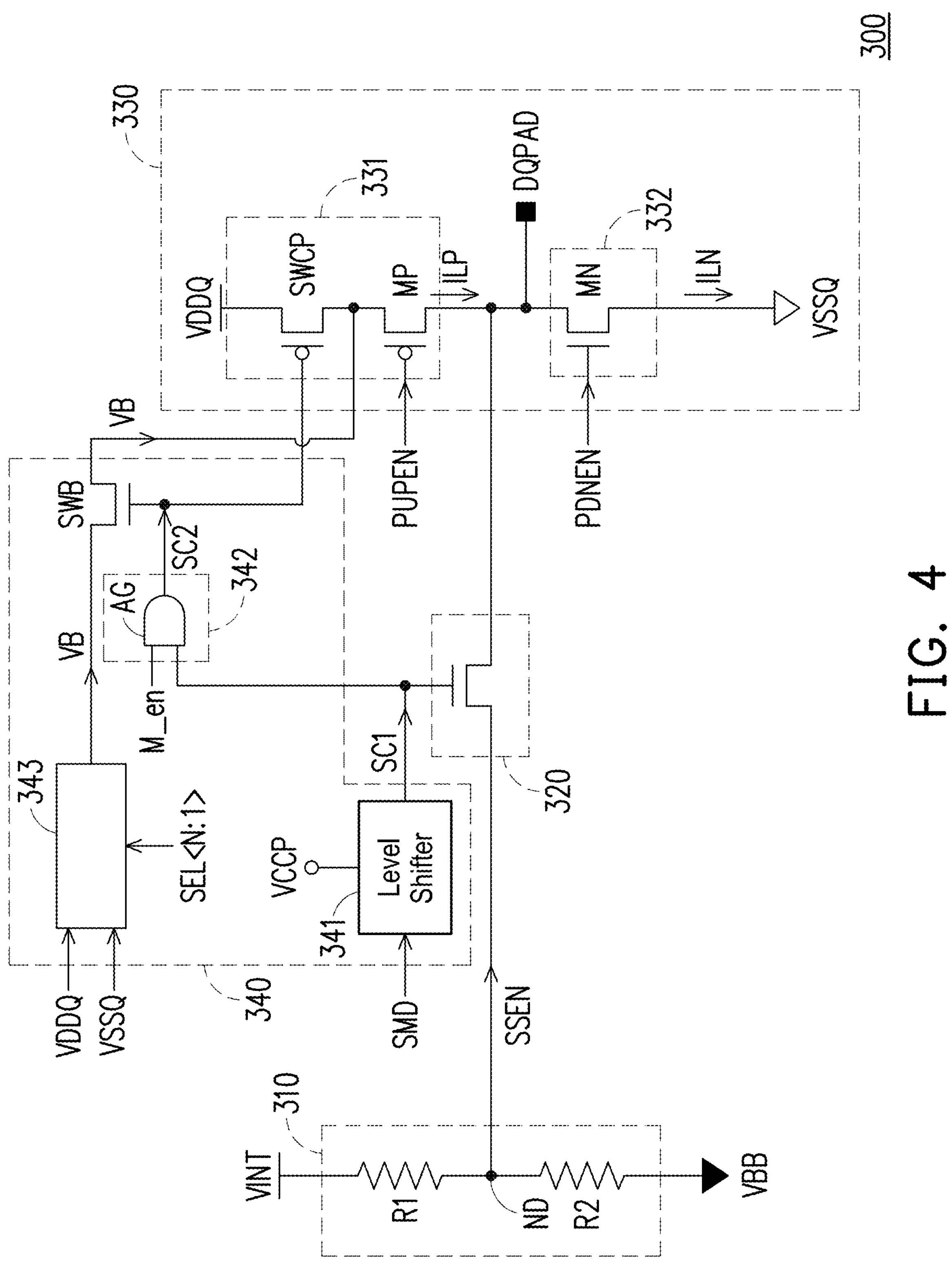
FIG. 4 illustrates a schematic diagram of a voltage monitor according to an embodiment of the disclosure.

Please refer to FIG. 4, FIG. 4 illustrates a schematic diagram of a voltage monitor according to an embodiment of the disclosure. In the embodiment, the voltage monitor 300 includes the voltage divider 310, the bridge switch 320, a OCD 330 and a control circuit 340. The voltage divider 310 includes dividing resistors R1 and R2. The dividing resistor R1 is coupled between the internal voltage VINT and the sensing node ND. The dividing resistor R2 is coupled between the sensing node ND and a background voltage VBB. The voltage divider 210 divides the internal voltage VINT to generate the sensing signal SSEN based on resistance values of the dividing resistors R1 and R2.

In the embodiment, the bridge switch 320 is coupled between the sensing node ND and the connecting pad DQPAD. The bridge switch 320 could be implemented by a n-type transistor, but the disclosure is not limited thereto.

In the embodiment, the OCD 330 includes a pull-up circuit 331 and a pull-down circuit 332. The pull-up circuit 331 includes the control switch SWCP and the pull-up switch MP. The pull-down circuit includes the pull-down switch MN. The first terminal of the control switch SWCP is coupled to the high reference voltage VDDQ. The pull-up switch MP is coupled between the second terminal of the control switch SWCP and the connecting pad DQPAD. The pull-down switch MN is coupled between the connecting pad DQPAD and the low reference voltage VSSQ. In the embodiment, the control switch SWCP could be implemented by a p-type transistor, but the disclosure is not limited thereto.

In the embodiment, the control circuit 340 includes a level shifter 341, a logic circuit 342 and a bias switch SWB. The level shifter 341 is coupled to a control terminal of the bridge switch 320. The level shifter 341 receives a mode signal SMD and generates the control signal SC1 in response to the mode signal SMD. In the test mode, the mode signal SMD has a first logic level, and the control signal SC1 has a first voltage level. In the normal mode, the mode signal SMD has a second logic level, and the control signal SC1 has a second voltage level.

For example, in the test mode, the mode signal SMD has a high logic level. The level shifter 341 shifts a voltage value of the mode signal SMD to generate the control signal SC1 having a high voltage level VCCP (that is, the first voltage level). The bridge switch 320 is turned on in response to the control signal SC1 having the first voltage level. The control switch SWCP is turned off in response to the control signal SC1 having the first voltage level.

For example, in the normal mode, the mode signal SMD has a low logic level. The level shifter 341 shifts the voltage value of the mode signal SMD to generate the control signal SC1 having a low voltage level (that is, the second voltage level). The bridge switch 320 is turned off in response to the control signal SC1 having the second voltage level. The control switch SWCP is turned on in response to the control signal SC1 having the second voltage level.

In some embodiments, the level shifter 341 could be implemented by a source follower, a buffer or a converter, but the disclosure is not limited thereto.

In the embodiment, the logic circuit 342 is coupled to the level shifter 341. The logic circuit 342 generates a control signal SC2 in response to the control signal SC1 and an enable signal M_en. In the embodiment, the logic circuit 342 performs "AND" logic operation on the control signal SC1 and an enable signal M_en to generates the control signal SC2. For example, the logic circuit 342 includes a AND gate AG, but the disclosure is not limited thereto. A first input terminal of the AND gate AG receives the enable signal. A second input terminal of the AND gate AG receives the control signal SC1. An output terminal of the AND gate AG outputs the control signal SC2.

A first terminal of the bias switch SWB receives the bias voltage VB. A second terminal of the bias switch SWB is coupled to the second terminal of the control switch SWCP. A control terminal of the bias switch SWB receives the control signal SC2. In the embodiment, in the test mode, the bias switch SWB is turned on in response to the control signal SC2 and transports the bias voltage VB to the second terminal of the control switch SCWP. The bias switch SWB could be implemented by a n-type transistor, but the disclosure is not limited thereto.

During the first period of the test mode, the control circuit 340 provides the enable signal M_en having the low logic level. The control signal SC2 has the low logic level or the second voltage level. Therefore, the control switch SWCP is turned on. The bias switch SWB is turned off. The pull-up switch MP is turned off in response to the enable signal PUPEN having the high logic level. The pull-down switch MN is turned off in response to the enable signal PDNEN having the low logic level. The control circuit 340 determines an absolute difference value between the first current value of the first leakage current ILP and the second current value of the second leakage current ILN.

During the first period of the test mode, if the sensing signal SSEN on the connecting pad DQPAD is always equal to a voltage of the high reference voltage VDDQ or low reference voltage VSSQ, the control circuit 340 determines that the absolute difference value between the first current value and the second current value is higher than the threshold value, the control circuit 340 provides the enable signal M_en having the high logic level during the second period after the first period. The control signal SC2 has the high logic level or the second voltage level. Therefore, the control switch SWCP is turned off. The bias switch SWB is turned on to transport the bias voltage VB to the second terminal of the control switch SCWP.

In the embodiment, the control circuit 340 further includes a multi-source circuit 343. The multi-source circuit 343 is coupled to the first terminal of the bias switch SWB. The multi-source circuit 343 adjusts the voltage value of the bias voltage VB in response to a selecting signal SEL<N:1>. The multi-source circuit 343 generates reference voltage values based on the high reference voltage VDDQ and the low reference voltage VSSQ. The multi-source circuit 343 selects a selected voltage value in response to the selecting signal SEL<N:1> and provides the bias voltage VB within the range between the low reference voltage VSSQ and the high reference voltage VDDQ in response to the selected voltage value.

Figure 5:
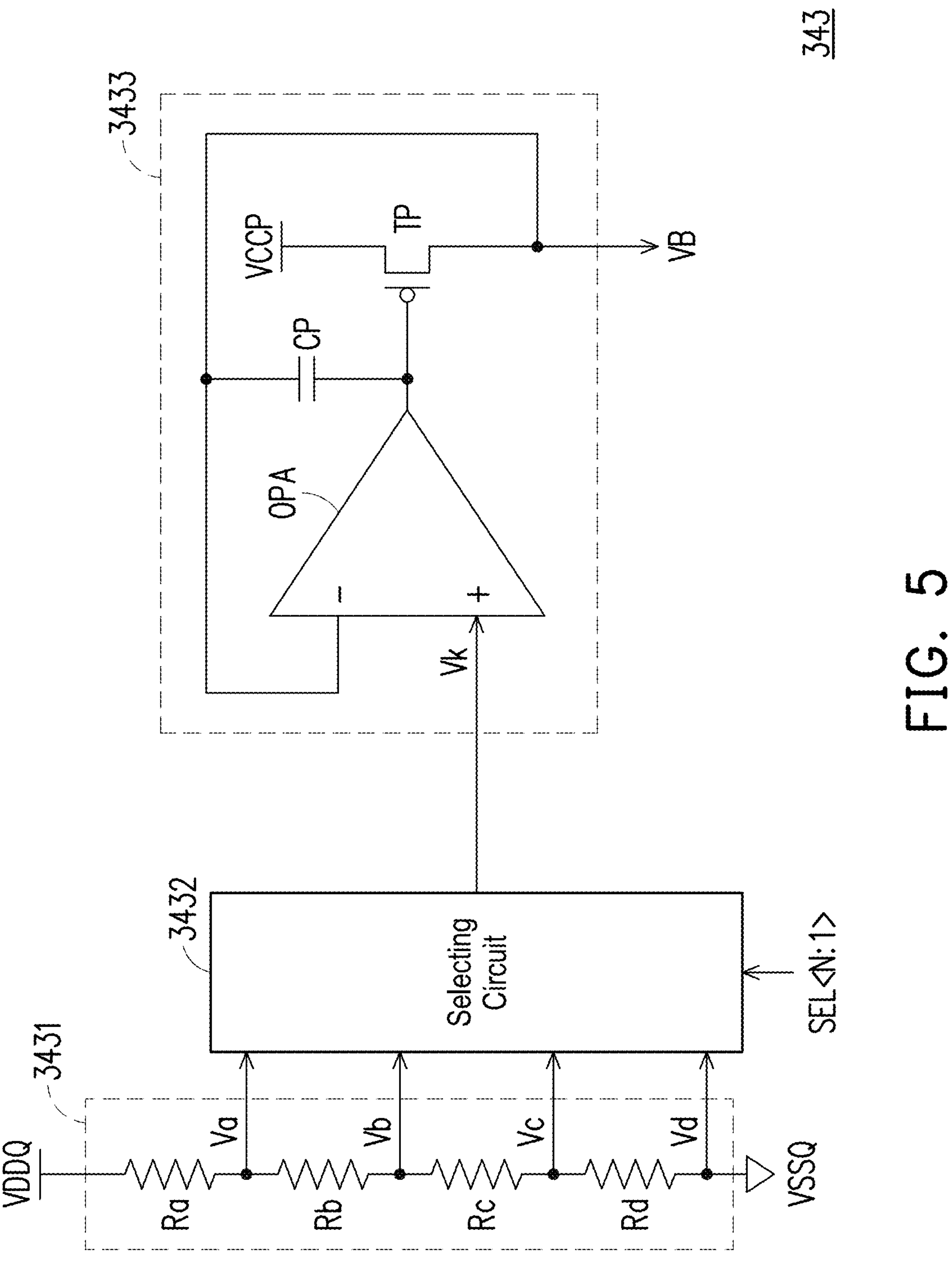
FIG. 5 illustrates a schematic diagram of a multi-source circuit according to an embodiment of the disclosure.

Please refer to FIG. 4 and FIG. 5, FIG. 5 illustrates a schematic diagram of a multi-source circuit according to an embodiment of the disclosure. In the embodiment, the multi-source circuit 343 includes a voltage divider 3431, a selecting circuit 3432 and a voltage regulator 3433. The second voltage divider 3431 is coupled between the high reference voltage VDDQ and the low reference voltage VSSQ. The voltage divider 3431 generates reference voltage values Va to Vd. For example, the voltage divider 3431 includes resistors Ra to Rd. The resistors Ra to Rd are connected in series between the high reference voltage VDDQ and the low reference voltage VSSQ. The reference voltage value Va is generated on a node of the resistor Ra and the resistor Rb. The reference voltage value Vb is generated on a node of the resistor Rb and the resistor Rc. The reference voltage value Vc is generated on a node of the resistor Rc and the resistor Rd. The reference voltage value Vd is generated on the low reference voltage VSSQ. For example, resistances of the resistors Ra to Rd are the same, but the disclosure is not limited thereto. The low reference voltage VSSQ is 0 volt, but the disclosure is not limited thereto. The reference voltage value Va is equal to 0.75× VDDQ. The reference voltage value Vb is equal to 0.5× VDDQ. The reference voltage value Vc is equal to 0.25× VDDQ. The reference voltage value Vd is equal to VSSQ.

In the embodiment, the selecting circuit 3432 is coupled to the voltage divider 3431. The selecting circuit 3432 selects a selected voltage value Vk in response to the selecting signal SEL<N:1> and provides the bias voltage VB in response to the selected voltage value. In the embodiment, the selecting circuit 3432 selects a selected voltage value Vk from the reference voltage values Va to Vd in response to the selecting signal SEL<N: 1>.

In the embodiment, the selecting circuit 3432 could be implemented by a switch network or multiplexer (MUX), but the disclosure is not limited thereto. The selecting signal SEL<N:1> may be a digital code having at least two bits, but the disclosure is not limited thereto.

Based on actual design or requirement, a number of the resistors in the voltage divider 3431 can be adjusted. The number of the resistors in the voltage divider 3431 is not limited thereto in the disclosure. Therefore, a number of the reference voltage values provided by the voltage divider 3431 can be adjusted. The number of the reference voltage values in the voltage divider 3431 is also not limited thereto in the disclosure. The selected voltage value Vk is a voltage value in a voltage value range between the high reference voltage VDDQ and the low reference voltage VSSQ.

In the embodiment, the voltage regulator 3433 is coupled to the selecting circuit 3432 and the first terminal of the bias switch SWB. The voltage regulator 3433 provides the bias voltage VB in response to the selected voltage value Vk. In other words, the voltage regulator 3433 sets the selected voltage value Vk to be the voltage value of the bias voltage VB.

In the embodiment, the voltage regulator 3433 includes an operating amplifier OPA and a transistor TP. A first input terminal of the operating amplifier OPA receives the selected voltage value Vk. A first terminal of the transistor TP receives an input reference voltage (for example, the high voltage level VCCP, but the disclosure is not limited thereto). A second terminal of the transistor TP is coupled to a second input terminal of the operating amplifier OPA. The second terminal of the transistor TP is used to output the bias voltage VB. A control terminal of the transistor TP is coupled to an output terminal of the operating amplifier OPA.

In the embodiment, the transistor TP could be implemented by a p-type transistor, but the disclosure is not limited thereto. The first input terminal of the operating amplifier OPA is a non-inverting input terminal. The second input terminal of the operating amplifier OPA is an inverting input terminal. Therefore, the voltage regulator 3433 is a native-feedback unit gain buffer or a low-dropout regulator (LDO) having driving ability.

For example, a voltage value of the input reference voltage (for example, the high voltage level VCCP) is in a range from 2.6 to 3.0 volts. A voltage value of the high reference voltage VDDQ is in a range from 1.0 to 1.4 volts. During the second period of the test mode, the control circuit 340 provides the enable signal M_en having the high logic level. The second period is also called as "multi-source mode". During the second period, if the control switch SWCP is turned off very thoroughly, the first current value of the first leakage current ILP is very low. The first current value of the first leakage current ILP is lower than the first current value of the second leakage current ILN. Therefore, the first leakage current ILP and the second leakage current ILN are still not balance (that is, ILP−ILN<0). The multi-source circuit 343 can increase the selected voltage value Vk to increase the voltage value of the bias voltage VB. The first current value of the first leakage current ILP is increased to match the first current value of the second leakage current ILN. Therefore, the first leakage current ILP and the second leakage current ILN are balance (that is, ILP−ILN≈0). In this way, the sensing signal SSEN on the connecting pad DQPAD is not interfered with the first leakage current ILP and the second leakage current ILN.

For example, during the second period of the test mode, if the control switch SWCP is not turned off, the first current value of the first leakage current ILP is high than the first current value of the second leakage current ILN. Therefore, the first leakage current ILP and the second leakage current ILN are still not balance (that is, ILP−ILN>0). The multi-source circuit 343 can decrease the selected voltage value Vk to decrease the voltage value of the bias voltage VB. The first current value of the first leakage current ILP is decreased to match the first current value of the second leakage current ILN. Therefore, the first leakage current ILP and the second leakage current ILN are balance (that is, ILP−ILN≈0). In this way, the sensing signal SSEN on the connecting pad DQPAD is not interfered with the first leakage current ILP and the second leakage current ILN.

Figure 6:
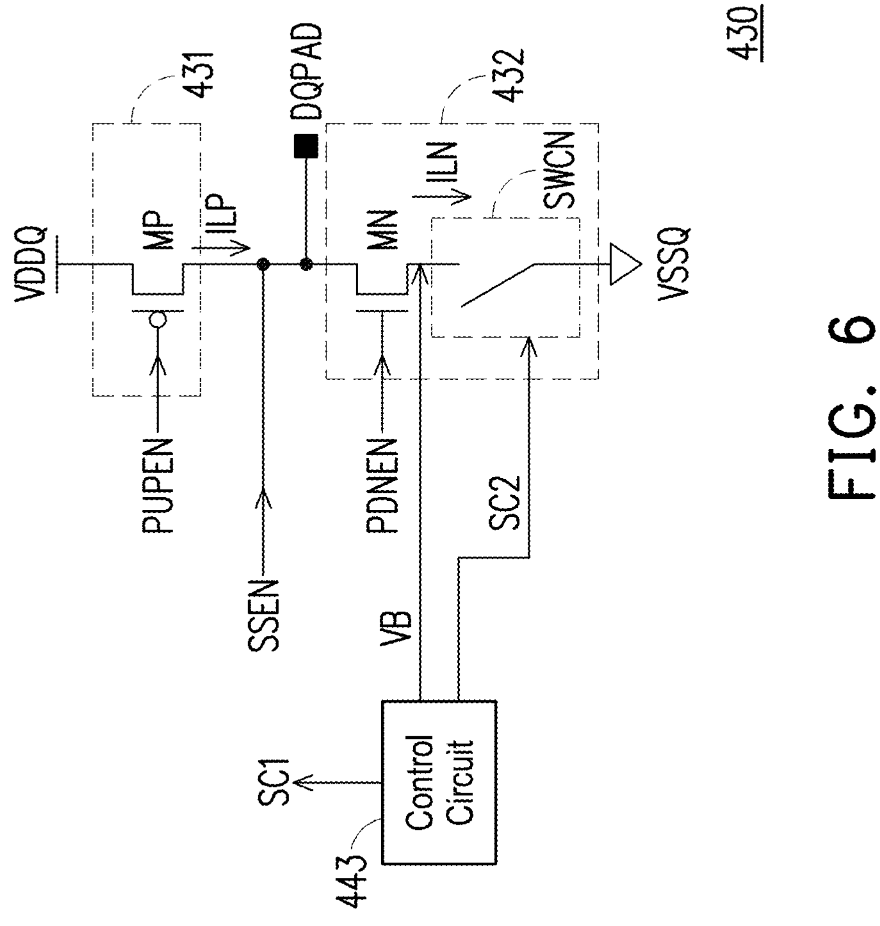
FIG. 6 illustrates a schematic diagram of an off-chip driver (OCD) according to an embodiment of the disclosure.

Please refer to FIG. 6, FIG. 6 illustrates a schematic diagram of an off-chip driver (OCD) according to an embodiment of the disclosure. In the embodiment, the OCD 430 includes the connecting pad DQPAD, a pull-up circuit 431, a pull-down circuit 432 and the control circuit 443. The connecting pad outputs the sensing signal SSEN corresponding to the internal voltage VINT in the memory device. The pull-up circuit 431 is coupled between a high reference voltage VDDQ and the connecting pad DQPAD. The pull-down circuit 432 includes a control switch SWCN and the pull-down switch MN. A first terminal of the control switch SWCN is coupled to the low reference voltage VSSQ. The pull-down switch MN is coupled between a second terminal of the control switch SWCN and the connecting pad DQPAD. The control circuit 443 is coupled to the pull-down circuit 432. When the memory device is in a test mode, the control circuit 443 turns off the control switch SWCN, and provides the bias voltage VB to the second terminal of the control switch SWCN to adjust a current flowing through the pull-down circuit 432.

In the embodiment, the control circuit 443 determines the absolute difference value between the first current value of the first leakage current ILP and the second current value of the second leakage current ILN. During the first period of the test mode, if the sensing signal SSEN on the connecting pad DQPAD is always equal to a voltage of the high reference voltage VDDQ or low reference voltage VSSQ, the control circuit 443 determines that the absolute difference value between the first current value and the second current value is higher than the threshold value. Therefore, the control circuit 443 turns off the control switch SWCN using the control signal SC2 and transports the bias voltage VB to the second terminal of the control switch SCWP, so as to decrease the absolute difference value between the first current value of the first leakage current ILP and the second current value of the second leakage current ILN. In the embodiment, the control circuit 443 controls a bridge switch (for example, the bridge switch 120 in FIG. 2, the bridge switch 120 in FIG. 3 or the bridge switch 320 in FIG. 4) using the control signal SC1.

In the embodiment, the control circuit 443 includes a multi-source circuit 441. The multi-source circuit 441 is coupled to the second terminal of the control switch SWCN. The multi-source circuit 441 provides the bias voltage VB within the range between the low reference voltage VSSQ and the high reference voltage VDDQ.

In some embodiments, the control circuit 443 may be arranged outside the OCD 430.

In view of the foregoing, in the test mode, the control circuit turns on the bridge switch and provides the bias voltage to the OCD to let the first current value of the first leakage current flowing through the pull-up circuit match the second current value of the second leakage current flowing through the pull-down circuit. Therefore, in the test mode, the first leakage current and the second leakage current on the connecting pad are balanced. In this way, the sensing signal on the connecting pad is not interfered with the first leakage current or the second leakage current in the test mode. The voltage monitor can improve the accuracy of the sensing signal on the connecting pad in the test mode.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A voltage monitor of a memory device, comprising:

a first voltage divider, coupled to a sensing node, and configured to receive an internal voltage in the memory device, and divide the internal voltage to generate a sensing signal on the sensing node;

a bridge switch, a first terminal of the bridge switch is coupled to the sensing node, a second terminal of the bridge switch is coupled to a connecting pad;

an off-chip driver, comprising:

a pull-up circuit, coupled between a high reference voltage and the connecting pad; and a pull-down circuit, coupled between the connecting pad and a low reference voltage; and a control circuit, coupled to the bridge switch and the off-chip driver, wherein in a test mode:

the control circuit turns on the bridge switch, and the control circuit provides a bias voltage to the off-chip driver to let a first current value of a first leakage current flowing through the pull-up circuit match a second current value of a second leakage current flowing through the pull-down circuit.

2. The voltage monitor of claim 1, wherein in a normal mode, the control circuit turns off the bridge switch and stops to provide the bias voltage.

3. The voltage monitor of claim 1, wherein:

the pull-up circuit comprises:

a control switch, a first terminal of the control switch is coupled to the high reference voltage; and a pull-up switch, coupled between a second terminal of the control switch and the connecting pad, and the pull-down circuit comprises:

a pull-down switch, coupled between the connecting pad and the low reference voltage.

4. The voltage monitor of claim 3, wherein in the test mode, the control circuit turns on the control switch, turns off the pull-up switch and the pull-down switch, and determines whether an absolute difference value between the first current value and the second current value is higher than a threshold value according to a voltage value of the sensing signal on the connecting pad.

5. The voltage monitor of claim 4, wherein when the sensing signal on the connecting pad is always equal to a voltage of the high reference voltage or low reference voltage, the control circuit determines the absolute difference value between the first current value and the second current value is higher than the threshold value, turns off the control switch, the pull-up switch and the pull-down switch, and provides the bias voltage to the second terminal of the control switch.

6. The voltage monitor of claim 3, wherein the control circuit comprises:

a level shifter, coupled to a control terminal of the bridge switch, and configured to receive a mode signal and generate a first control signal in response to the mode signal;

a logic circuit, coupled to the level shifter, and configured to generate a second control signal in response to the first control signal and an enable signal; and a bias switch, a first terminal of the bias switch receives the bias voltage, a second terminal of the bias switch is coupled to the second terminal of the control switch, a control terminal of the bias switch receives the second control signal.

7. The voltage monitor of claim 6, wherein in the test mode, the bias switch is turned on in response to the second control signal and transports the bias voltage to the second terminal of the control switch.

8. The voltage monitor of claim 6, wherein the logic circuit comprises:

a AND gate, a first input terminal of the AND gate receives the enable signal, a second input terminal of the AND gate receives the first control signal, an output terminal of the AND gate outputs the second control signal.

9. The voltage monitor of claim 6, wherein the control circuit further comprises:

a multi-source circuit, coupled to the first terminal of the bias switch, and configured to adjust a voltage value of the bias voltage in response to a selecting signal.

10. The voltage monitor of claim 9, wherein the multi-source circuit comprises:

a second voltage divider, coupled between a high reference voltage and a low reference voltage, and configured to generate a plurality of reference voltage values; and a selecting circuit, coupled to the second voltage divider, and configured to select one of the plurality of reference voltage values to be a selected voltage value in response to the selecting signal.

11. The voltage monitor of claim 10, wherein the multi-source circuit further comprises:

a voltage regulator, coupled to the selecting circuit and the first terminal of the bias switch, and configured to provide the bias voltage in response to the selected voltage value.

12. The voltage monitor of claim 11, wherein the voltage regulator comprises:

an operating amplifier, a first input terminal of the operating amplifier receives the selected voltage value; and a transistor, a first terminal of the transistor receives an input reference voltage, a second terminal of the transistor is coupled to a second input terminal of the operating amplifier, a control terminal of the transistor is coupled to an output terminal of the operating amplifier.

13. The voltage monitor of claim 6, wherein:

in the test mode, the mode signal has a first logic level, and the first control signal has a first voltage level; and in a normal mode, the mode signal has a second logic level, and the first control signal has a second voltage level.

14. The voltage monitor of claim 13, wherein:

in the test mode, the bridge switch is turned on in response to the first control signal having the first voltage level, and in the normal mode, the bridge switch is turned off in response to the first control signal having the second voltage level.

15. An off-chip driver of a memory device, comprising:

a connecting pad, configured to output a sensing signal corresponding to an internal voltage in the memory device;

a pull-up circuit, comprising:

a control switch, a first terminal of the control switch is coupled to a high reference voltage; and a pull-up switch, coupled between a second terminal of the control switch and the connecting pad; and a pull-down circuit, coupled between the connecting pad and a low reference voltage; and a control circuit, coupled to the pull-up circuit;

wherein when the memory device is in a test mode, the control circuit turns off the control switch, and provides a bias voltage to the second terminal of the control switch to adjust a first current flowing through the pull-up circuit.

16. The off-chip driver of claim 15, wherein the control circuit comprises:

a multi-source circuit, coupled to the second terminal of the control switch and configured to provide the bias voltage within the range between the low reference voltage and the high reference voltage.

17. An off-chip driver of a memory device, comprising:

a connecting pad, configured to output a sensing signal corresponding to an internal voltage in the memory device;

a pull-up circuit, coupled between a high reference voltage and the connecting pad; and a pull-down circuit, comprising:

a control switch, a first terminal of the control switch is coupled to a low reference voltage; and a pull-down switch, coupled between a second terminal of the control switch and the connecting pad; and a control circuit, coupled to the pull-down circuit;

wherein when the memory device is in a test mode, the control circuit turns off the control switch, and provides a bias voltage to the second terminal of the control switch to adjust a current flowing through the pull-down switch.

18. The off-chip driver of claim 17, wherein the control circuit comprises:

a multi-source circuit, coupled to the second terminal of the control switch and configured to provide the bias voltage within the range between the low reference voltage and the high reference voltage.

* * * * *